(12) United States Patent
Cheng et al.

(10) Patent No.: US 9,059,242 B2
(45) Date of Patent: Jun. 16, 2015

(54) FINFET SEMICONDUCTOR DEVICE HAVING INCREASED GATE HEIGHT CONTROL

(71) Applicant: International Business Machines Corporation, Armonk, NY (US)

(72) Inventors: Kangguo Cheng, Guilderland, NY (US); Ali Khakifirooz, Mountain View, CA (US); Shom Ponoth, Clifton Park, NY (US); Raghavasimhan Sreenivasan, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 232 days.

(21) Appl. No.: 13/685,733

(22) Filed: Nov. 27, 2012

(65) Prior Publication Data
US 2014/0145263 A1 May 29, 2014

(51) Int. Cl.
*H01L 21/76* (2006.01)
*H01L 21/762* (2006.01)
*H01L 27/12* (2006.01)
*H01L 21/84* (2006.01)
*H01L 29/66* (2006.01)

(52) U.S. Cl.
CPC ...... *H01L 21/76205* (2013.01); *H01L 27/1211* (2013.01); *H01L 21/845* (2013.01); *H01L 29/6681* (2013.01)

(58) Field of Classification Search
USPC ........................................................ 438/425
See application file for complete search history.

(56) References Cited

U.S. PATENT DOCUMENTS

| | | | |
|---|---|---|---|
| 6,642,090 B1 | 11/2003 | Fried et al. | |
| 7,098,477 B2 | 8/2006 | Zhu et al. | |
| 7,517,637 B2 | 4/2009 | Colburn et al. | |
| 7,545,008 B2 | 6/2009 | Chan et al. | |
| 7,709,380 B2 | 5/2010 | Veloso | |
| 7,939,392 B2 | 5/2011 | Chung et al. | |
| 7,977,181 B2 | 7/2011 | Lai et al. | |
| 2011/0057267 A1 | 3/2011 | Chuang et al. | |
| 2012/0104505 A1 | 5/2012 | Henson | |

OTHER PUBLICATIONS

H. Kawasaki et al., Challenges and solutions of FinFET integration in an SRAM cell and a logic circuit for 22 nm node and beyond, 2009 IEEE International Electron Devices Meeting (IEDM), Dec. 7-9, 2009, 4 pages.

(Continued)

*Primary Examiner* — Marvin Payen
(74) *Attorney, Agent, or Firm* — Cantor Colburn LLP; Steven Meyers

(57) ABSTRACT

A semiconductor device includes a silicon-on-insulator (SOI) substrate having a buried oxide (BOX) layer, and a plurality of semiconductor fins formed on the BOX layer. The plurality of semiconductor fins include at least one pair of fins defining a BOX region therebetween. Gate lines are formed on the SOI substrate and extend across the plurality of semiconductor fins. Each gate line initially includes a dummy gate and a hardmask. A high dielectric (high-k) layer is formed on the hardmask and the BOX regions. At least one spacer is formed on each gate line such that the high-k layer is disposed between the spacer and the hardmask. A replacement gate process replaces the hardmask and the dummy gate with a metal gate. The high-k layer is ultimately removed from the gate line, while the high-k layer remains on the BOX region.

19 Claims, 21 Drawing Sheets

(56) References Cited

OTHER PUBLICATIONS

L. Witters et al., Multiple-Vt FinFET devices through La2O3 dielectric capping, IEEE International SOI Conference, Oct. 6-9, 2008, pp. 121-122.

M. L. Green et al., Nucleation and growth of atomic layer deposited HfO2 gate dielectric layers on chemical oxide (SiOH) and thermal oxide (SiO2 or SiON) underlayers, Journal of Applied Physics, vol. 92, Issue 12, 2002, pp. 7168-7174.

R. Chen et al., Chemistry for Positive Pattern Transfer Using Area-Selective Atomic Layer Deposition, Advanced Materials. vol. 18, Issue 8, Apr. 2006, pp. 1086-1090.

FINFET SEMICONDUCTOR DEVICE HAVING INCREASED GATE HEIGHT CONTROL

BACKGROUND

The present disclosure relates generally to semiconductor devices, and more specifically, to improving gate height control of gate stacks in a finFET semiconductor device.

A replacement metal gate (RMG) process may be employed in a semiconductor fabrication processes to form a metal gate stack in a semiconductor device. The conventional RMG process typically employs a hardmask comprising, for example nitride, which is formed on an upper surface of a dummy gate. The dummy gate is ultimately removed and replaced with a metal gate. Prior to incorporating the metal gate, however, the hardmask serves to protect the dummy gate from epitaxial growth and erosion during the spacer etching process for example.

In semiconductor devices including both an N-region and a P-region in close proximity of one another, an N-P overlap region may exist where the n-region and the p-region overlap with each other. The N-P overlap region may be unresponsive to the etching process used to remove the hardmask, thereby causing a variation in the height of the hardmask layer. Consequently, the hardmask layer may require over-etching to completely remove the hardmask from the dummy gate. However, the over-etching may cause spacers divots, i.e., excess erosion of the spacers surrounding the gate stack, which leads to poor gate height control. Further, the spacer divots may lead to the formation of a metal gate stack that extends laterally beyond the width of the spacers allowing for adjacent metal gate stacks to contact one another.

SUMMARY

According to one embodiment of the present disclosure, a method of fabricating a semiconductor device comprises forming a plurality of semiconductor fins and a plurality of gate lines on a silicon-on-insulator (SOI) substrate. Each gate line comprises a gate stack including a dummy gate and a hardmask formed on the dummy gate. The method further includes selectively forming a gate stack high dielectric (high-k) layer on the hardmask, and forming at least one spacer on each gate line. The gate stack high-k layer of each gate line is disposed between the at least one spacer and the hardmask.

In another embodiment of the disclosure, a method of preventing spacer divots in a gate stack of a SOI semiconductor finFET comprises simultaneously forming a first high dielectric (high-k) layer on a buried oxide (BOX) region located between pairs of semiconductor fins and forming a second high-k layer on a hardmask disposed on a dummy gate of the gate stack. The method further includes forming at least one spacer on each gate line. The second high-k layer is disposed between the at least one spacer and the hardmask. The method further includes etching the at least one spacer below the second high-k layer via a first etching process, and etching a first portion of the second high-k layer via a second etching process different from the first etching process to expose the hardmask.

In still another embodiment of the disclosure, a semiconductor device comprises a silicon-on-insulator (SOI) substrate including a buried oxide (BOX) layer and a plurality of semiconductor fins formed on the BOX layer. At least one pair of fins defines a BOX region therebetween. The semiconductor device further includes a plurality of gate lines formed on the SOI substrate. Each gate line includes a metal gate stack. At least one spacer is formed on each metal gate stack, and a protective layer is formed on the BOX region.

Additional features and utilities are realized through the techniques of the present disclosure. Other embodiments and features of the disclosure are described in detail herein and are considered a part of the claimed disclosure. For a better understanding of the disclosure and features of the various embodiments, the following description and accompanying drawings are provided.

BRIEF DESCRIPTION OF THE SEVERAL VIEWS OF THE DRAWINGS

The subject matter of various embodiments of the disclosure is particularly pointed out and distinctly claimed in the claims at the conclusion of the specification. The forgoing and other features, and utilities of the disclosure are apparent from the following detailed description taken in conjunction with the accompanying drawings in which:

FIGS. 1-16 are a series of views illustrating a method of controlling a height of a gate stack formed in a finFET device according to embodiments of the disclosure, in which:

FIG. 1 illustrates a top view of silicon-on-insulator (SOI) finFET semiconductor device following a polycarbonate gate line patterning process;

FIG. 3 illustrates the SOI finFET semiconductor device shown in FIG. 1 after selectively depositing a high dielectric (high-k) layer on hardmask regions of the gate lines and buried oxide (BOX) regions of the SOI FinFET device;

FIG. 4 illustrates cross-sectional isometric views of the N-region and N/P regions of the semiconductor device shown in FIG. 3 taken along lines A-A and B-B respectively;

FIG. 5 illustrates the first doped region and the doping overlap region illustrated in FIG. 4 following a first nitride spacer deposition on the gate lines;

FIG. 6 illustrates the nitride spacer formed on the first doped region and the doping overlap region shown in FIG. 5 after performing a first spacer etching process on the first doped region;

FIG. 7 illustrates the nitride spacer formed on the first doped region and the doping overlap region shown in FIG. 6 after performing a second spacer etching process on the doping overlap region;

FIG. 8 illustrates formation of a second nitride spacer layer on the first doped region and the doping overlap region shown in FIG. 7;

FIG. 9 illustrates the first doped region and the doping overlap region shown in FIG. 8 after performing a reactive ion etching process on the second nitride spacer layer;

FIG. 10 illustrates the first doped region and the doping overlap region illustrated in FIG. 9 following a high density plasma (HDP) oxide deposition;

FIG. 11 illustrates removal of the high-k layer following a first high-k etching process performed on an upper portion of the first doped region and the doping overlap region illustrated in FIG. 10;

FIG. 12 illustrates removal of a hardmask layer from the first doped region and the doping overlap region illustrated in FIG. 11;

FIG. 13 illustrates removal of the high-k layer from first nitride spacers of the first doped region and the doping overlap region illustrated in FIG. 12 following a second high-k etching process;

FIG. 14 illustrates a top view of a semiconductor device including the first doped region and the doping overlap region illustrated in FIG. 13 showing the high-k layer remaining on BOX regions;

FIG. 15 illustrates cross-sectional isometric views of the first doped region and the doping overlap region of the semiconductor device shown in FIG. 14 taken along lines A-A and B-B respectively;

FIG. 16 illustrates the first doped region and the doping overlap region of FIG. 15 having a void in the gate lines after removing a polysilicon dummy gate;

DETAILED DESCRIPTION

Figure 1:
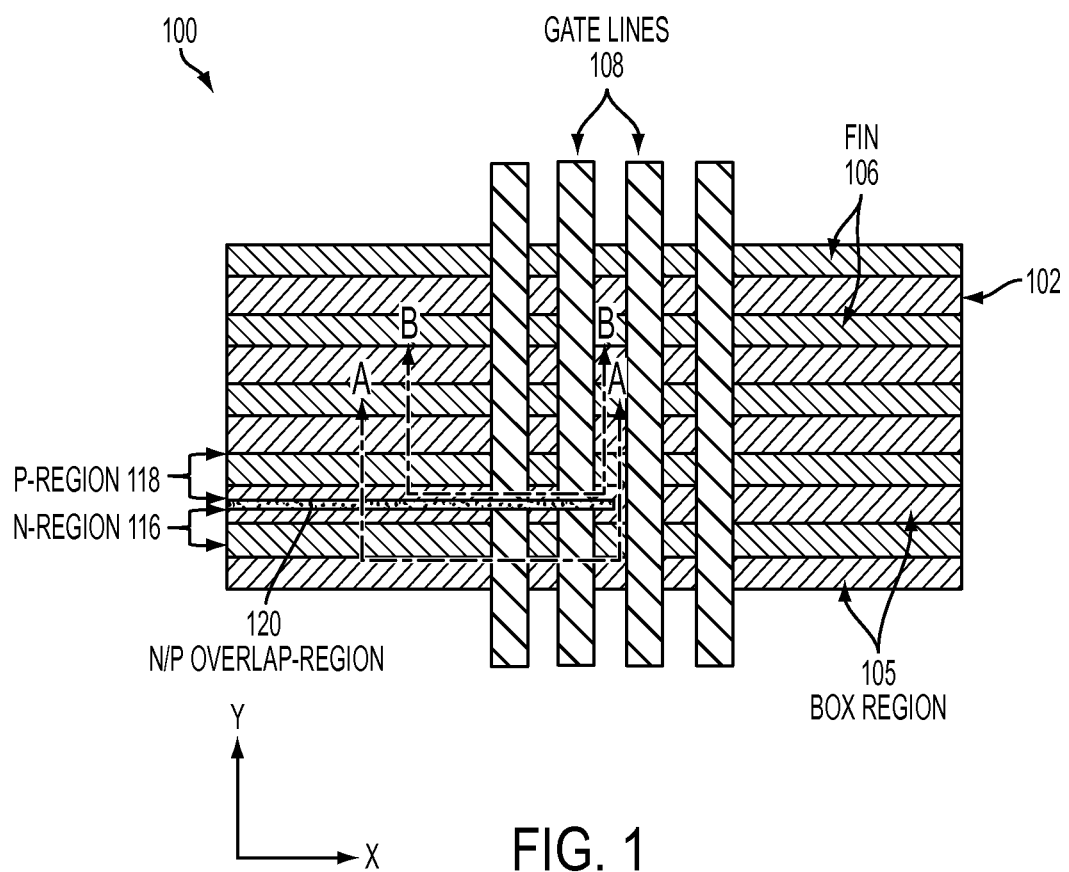
Figure 2A:
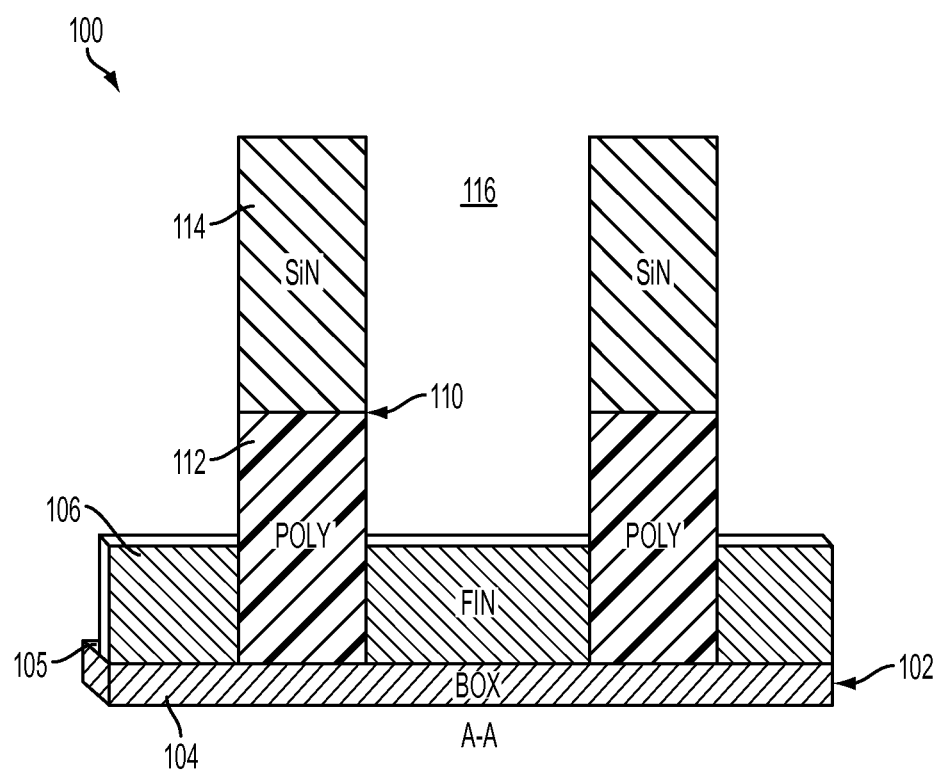
FIG. 2A is a cross-sectional isometric view of the SOI FinFET device shown in FIG. 1 taken along line A-A illustrating a first doped region of the SOI finFET semiconductor device shown in FIG. 1.
Figure 2B:
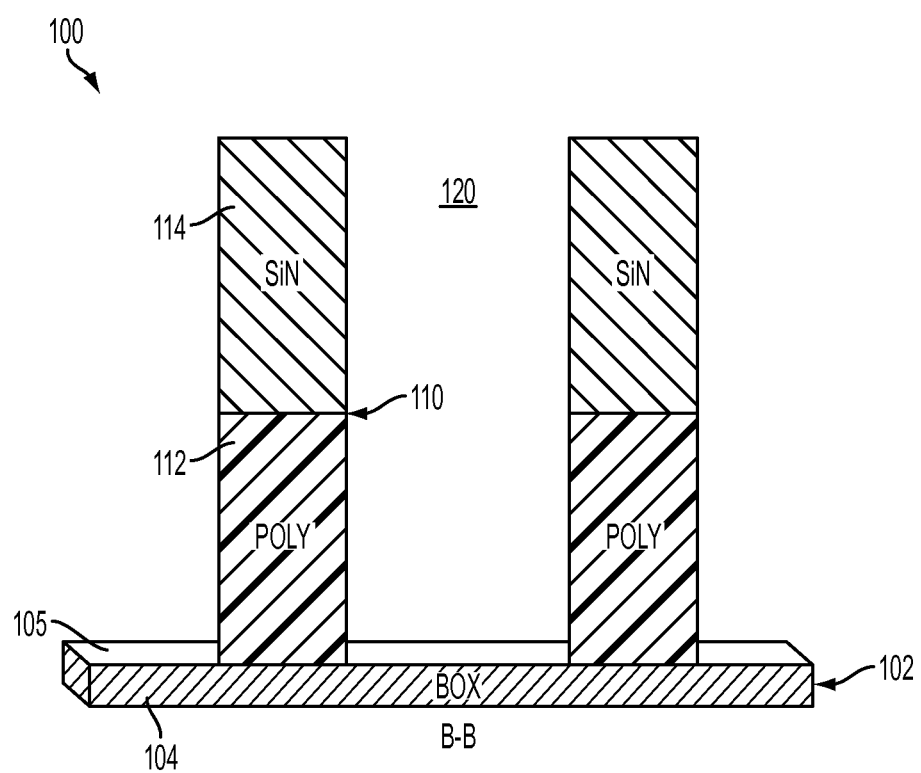
FIG. 2B is a cross-sectional isometric view taken along line B-B illustrating a doping overlap region of the SOI finFET semiconductor device shown in FIG. 1.

Referring now to FIGS. 1-2A, a silicon-on-insulator (SOI) finFET semiconductor device having undergone semiconductor fin patterning and polycarbonate gate line patterning processes is illustrated. The SOI finFET semiconductor device 100 may be, for example, an SRAM device as illustrated in FIG. 1, but the present disclosure is not limited thereto. The SOI finFET semiconductor device 100 includes an SOI substrate 102 extending along an X-axis to define a length, and a Y-axis perpendicular to the X-axis to define a width. The SOI substrate includes a buried oxide (BOX) layer 104. The BOX layer 104 may comprise, for example, silicon oxide ($SiO_2$). One or more semiconductor fins 106 are patterned on an upper surface of the BOX layer 104. The semiconductor fins 106 may be formed from, for example, silicon (Si). In at least one embodiment illustrated in FIG. 1, for example, a plurality of semiconductor fins 106 are spaced between one another by a predetermined distance, i.e., pitch. The semiconductor fins 106 extend from the BOX layer 104 at a height ranging, for example, of about 10 nm to about 70 nm. Accordingly, a BOX region 105 of the BOX layer 104 is located between each semiconductor fin 106.

One or more gate lines 108 are formed on the SOI substrate 102. In at least one embodiment, for example, the gate lines extend perpendicular to and over the semiconductor fins 106. The gate lines 108 may be formed, for example, from polycarbonate (PC). Each gate line 108 includes a gate stack 110 comprising a dummy gate 112 and a hardmask 114. The dummy gate 112 may be formed from, for example, polysilicon. The hardmask 114 may be formed on an upper surface of the dummy gate 112 and may comprise, for example, from a thermal oxide, a thermal oxynitride or a chemical oxide material. In at least one embodiment of the disclosure, the hardmask 114 may comprise, for example, mononitride (SiN) or silicon nitride ($Si_3N_4$). The hardmask 114 may protect the underlying dummy gate 112 during conventional epitaxial growth processes.

The SOI finFET semiconductor device 100 may further comprise a first doped region 116, a second doped region 118 that is different from the first doped region 116, and a doping overlap region where the first and second doped regions overlap each other, as illustrated in FIG. 1. The first doped region may be substantially doped with first impurities and the second doped region may be substantially doped with second impurities different from the first impurities. Referring to FIG. 1, for example, the first doped region may include an N-region 116 doped with pentavalent impurities including, but not limited to, antimony (Sb), arsenic (As) or phosphorous (P), and the second doped region may include a P-region 118 doped with trivalent impurities including, but not limited to, boron (B), aluminum (Al) or gallium (Ga). The doping overlap region may include, for example, an N/P overlap region 120 where the N-region 116 and the P-region 118 overlap one another as further illustrated in FIG. 1. The N-region 116 may include a region having a semiconductor fin 106 formed therein, as illustrated in FIG. 2A. However, the N/P overlap region 120 may be much smaller than the N-region 116. For example, the N/P overlap region 120 may have a width of about 3 nanometers (nm). Accordingly, the N/P overlap region 120 may exist at an area of the SOI substrate 102 that excludes a semiconductor fin 106, as illustrated for example in FIG. 2B.

Figure 3:
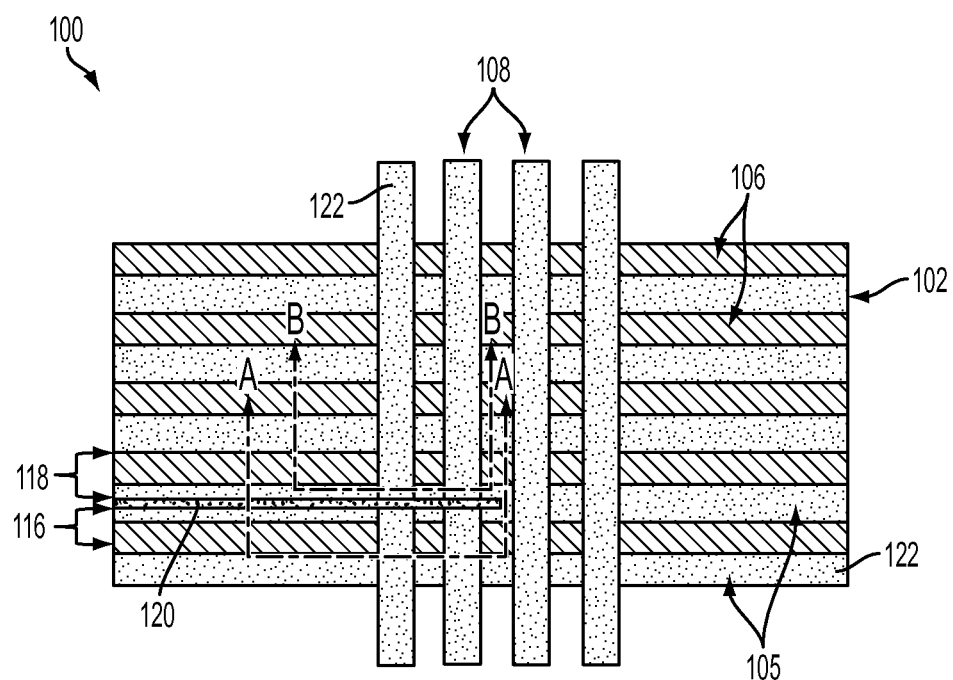
Figure 4:
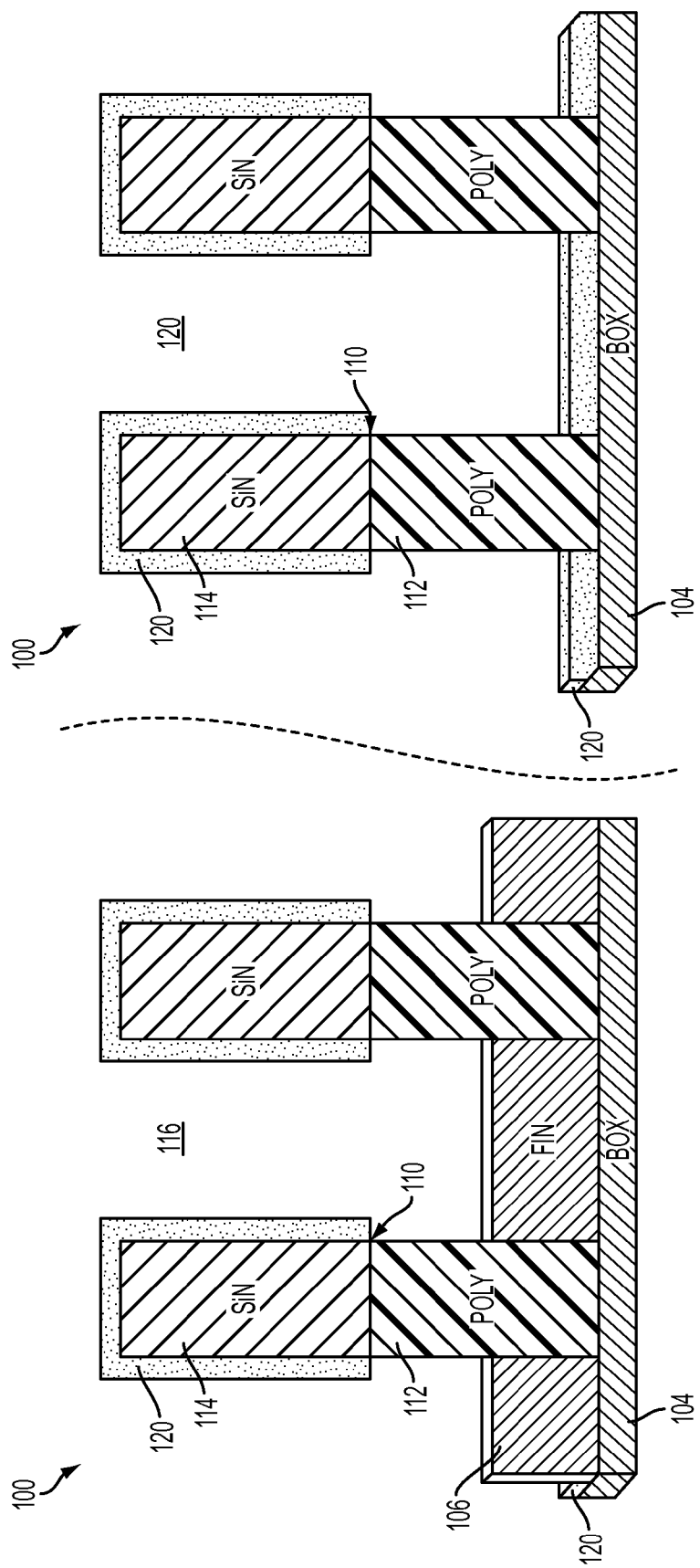

Referring now to FIGS. 3-4, a protective layer 122 is selectively formed on the SOI finFET semiconductor device 100. The protective layer 122 may comprise a high dielectric (high-k) material such as, for example, hafnium(IV) oxide ($HfO_2$). Hereinafter, the protective layer 122 will be referred to as a high-k layer 122. However, it is appreciated that the protective layer 122 is not limited to a high-k material.

In at least one embodiment, the high-k layer 122 is selectively formed on the BOX regions 105 located between the semiconductor fins 106 and the hardmask 114 of each gate stack 110. Further, the high-k layer 122 may have a thickness ranging from about 1 nm to about 5 nm. In at least one embodiment of the disclosure, the high-k layer 122 may be simultaneously formed on the BOX regions 105 and the hardmasks 114. A selective etching feature may be achieved since the high-k layer 122 may be responsive to a first high-k etching process capable of reacting with a high-k material, which is different from a second etching process, such as a conventional reactive-ion etching (RIE) process for example, conventionally utilized to etch gate stack spacers. In at least one embodiment of the disclosure, the high-k etching process may include a Carina™ etching process available from Applied Materials. Accordingly, the high-k layer 122 may serve to prevent spacer divots during replacement metal gate (RMG) processing as discussed in greater detail below.

The high-k layer 122 may be formed in various ways including, but not limited to, atomic layer deposition (ALD). In at least one embodiment of the disclosure, positive patterning ALD is applied to the SOI finFET semiconductor device 100 to selectively grow the high-k layer 122 on the hardmask 114 and the BOX regions 105, while inhibiting growth of the high-k layer 122 on the semiconductor fins 106. More specifically, the positive patterning ALD process employs blocking copolymers (R) that attach to elements of the SOI finFET substrate 102 formed from the Si, such as the semiconductor fins 106. The blocking copolymers (R) resist growth of the high-k layer 122. Accordingly, the blocking copolymers (R) selectively block the high-k layer 122 from forming on the semiconductor fins 106, while the high-k layer 122 is allowed to form on areas excluding the blocking co-polymers (R) such as the exposed hardmask 114 and BOX regions 105 as illustrated in FIGS. 3-4.

In another embodiment, the high-k layer 22 is selectively grown on the exposed hardmask 114 and the BOX regions 105 using nucleation ALD. More specifically, the high-k layer 122 is responsive to nucleation on oxide or oxynitride materials including, but not limited to, SiN, $SiO_2$, Si—O—H, and Si—O—N, while being inherently resistive to nucleation, i.e., growth, on hydrogen terminated material, such as Si. As discussed above, the BOX regions 105 may comprise $SiO_2$, the hardmask 114 may comprise SiN, and the semiconductor fins 106 may be formed from Si. Accordingly, the high-k layer 122 may be selectively grown on the BOX regions 105 and the hardmask 114, while the high-k layer 122 is prevented from growing on the semiconductor fins 106 as illustrated in FIGS. 3-4.

Figure 5:
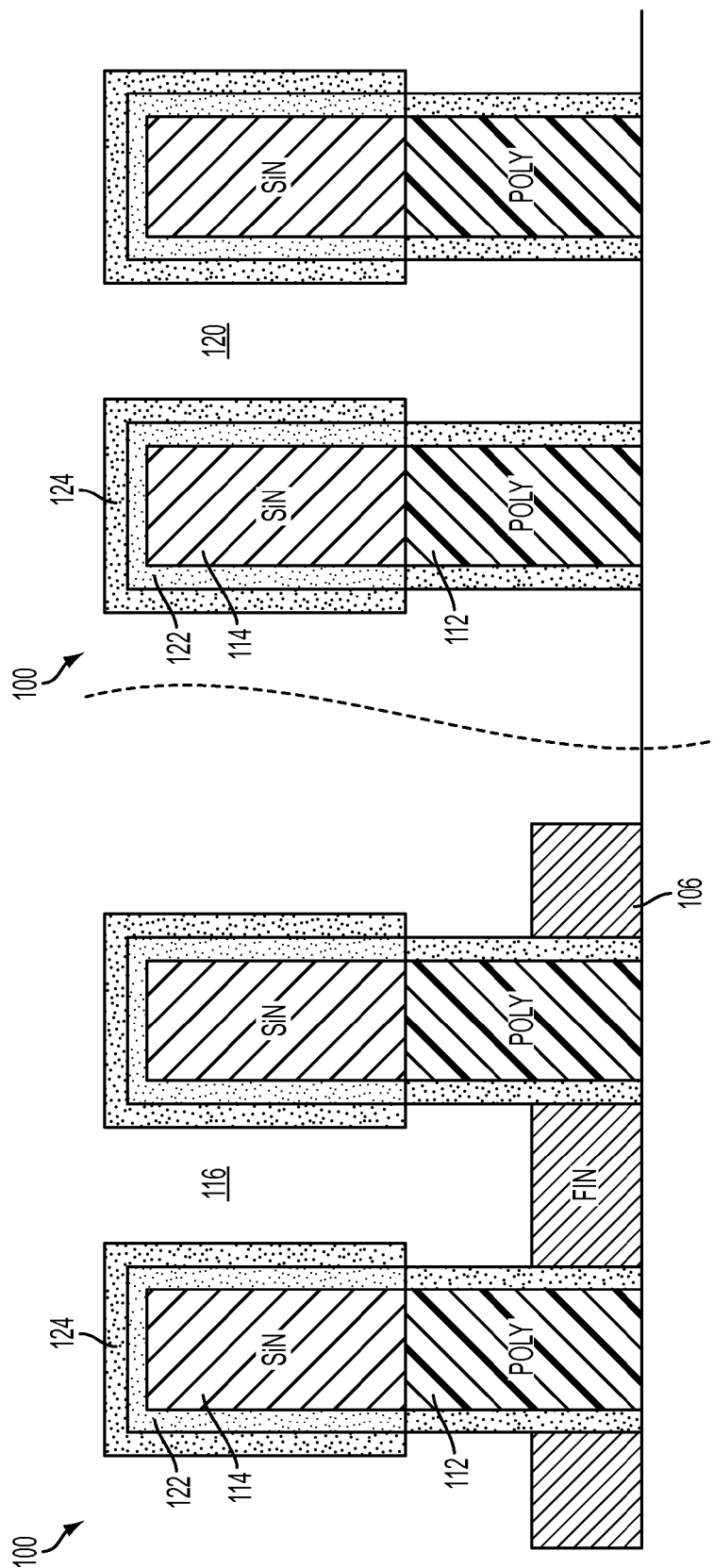

Referring now to FIG. 5, a first spacer 124 is formed on the gate lines 108 located in both a first doped region, such as the N-region 116, and an overlap region, such as the N/P overlap region 120. The first spacer 124 may be comprise a nitride material, for example, and may be deposited on the outer surfaces of the gate stack 110 via ion radical assisted deposition (iRAD).

Figure 6:
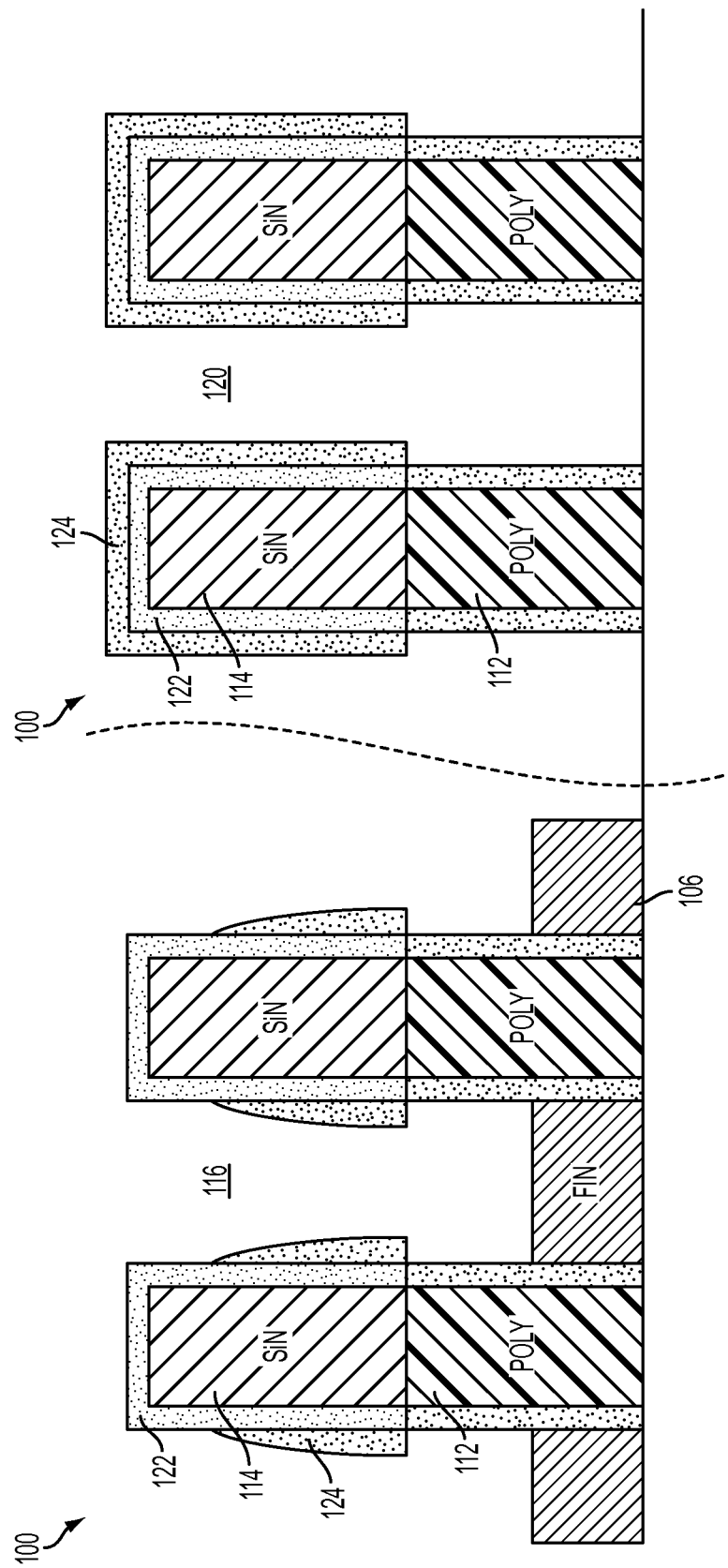
Figure 7:
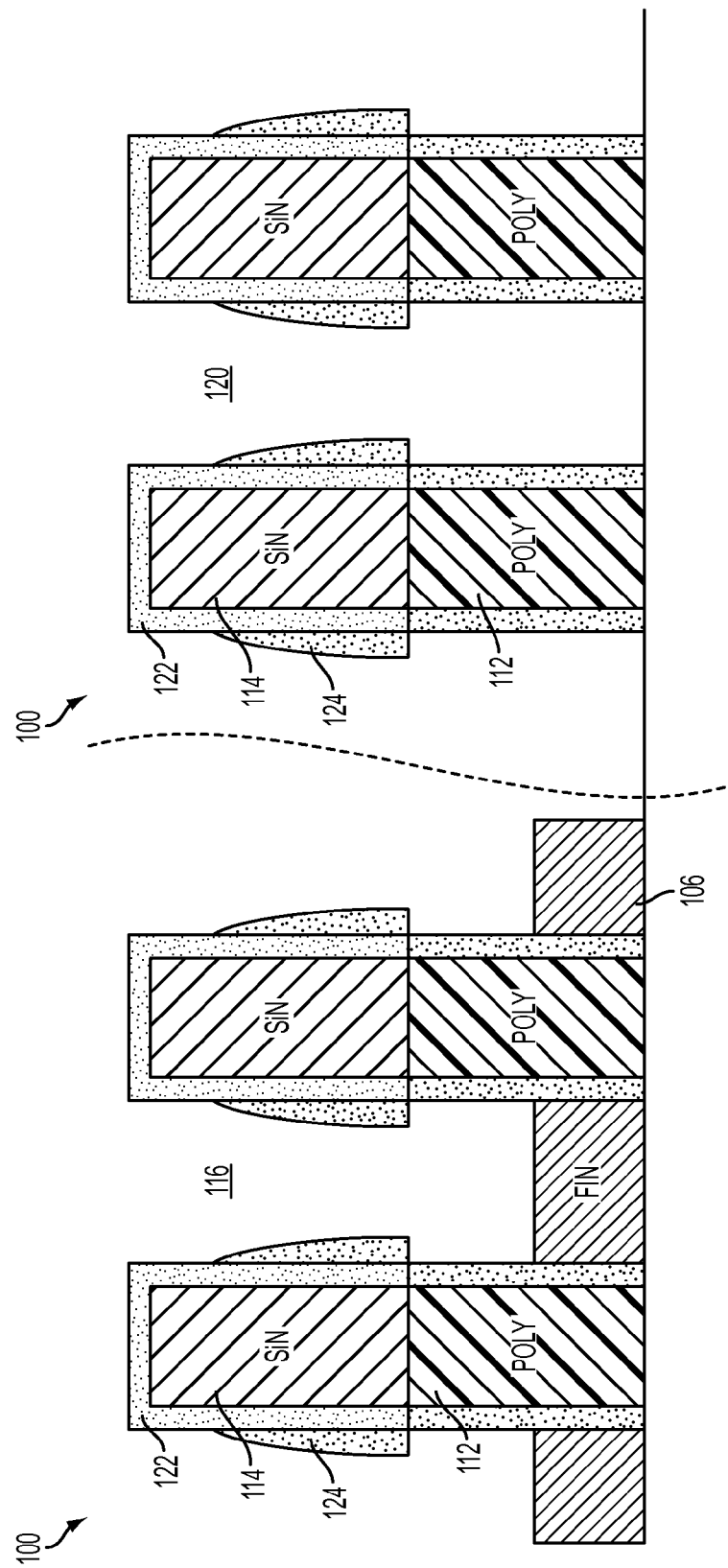

The first spacers 124 may be etched to expose the underlying high-k layer 122 as illustrated in FIGS. 6-7. More specifically, a first etching process, such as reactive ion etching (RIE), for example, may be performed to etch the first spacers 124 formed on the gate lines 108 located in the N-region 116 as illustrated in FIG. 6. Thereafter, a second etching process, for example a second RIE, may be performed to etch the first spacers 124 formed on gate lines 108 located in the N/P overlap region 120 as illustrated in FIG. 7.

Figure 8:
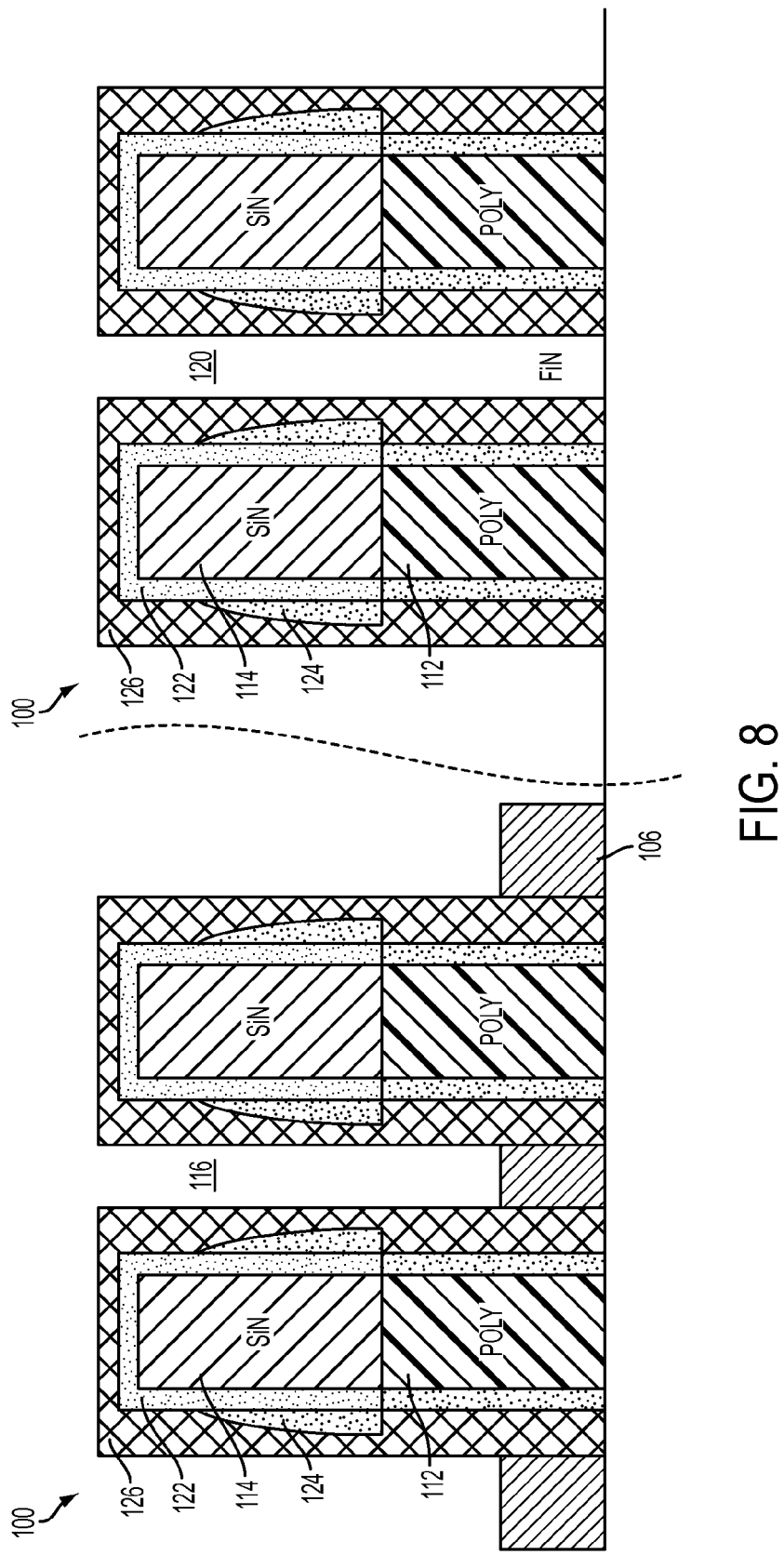
Figure 9:
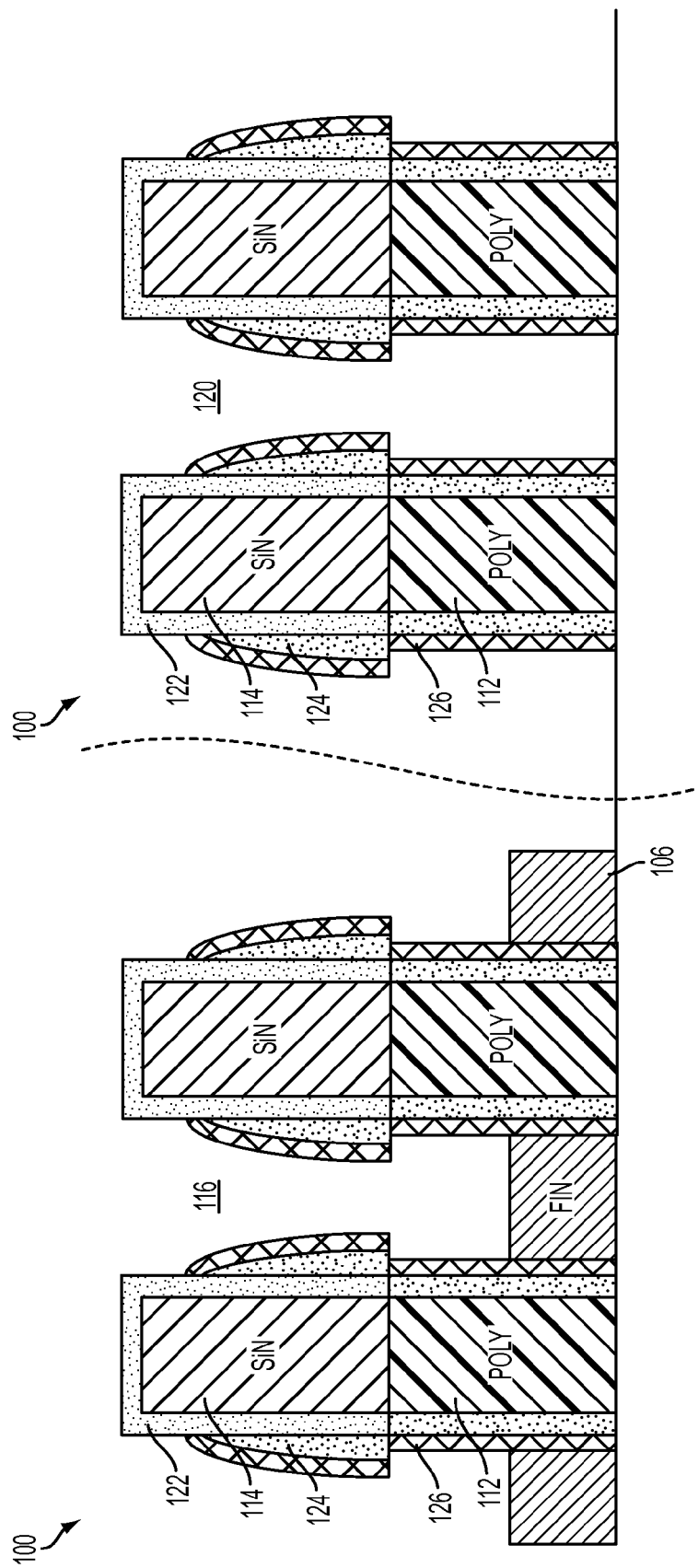

Referring now to FIG. 8, a second spacer layer 126 is deposited on the gate lines 108 located in the N-region 116 and the N/P overlap region 120 to cover the etched spacers 124. The second spacer layer 126 may then be etched according to an etching process, such as RIE, as illustrated in FIG. 9. The second spacers 126 disposed on the gate lines 108 located in the N/P overlap region 120 may be etched simultaneously the second spacers 126 disposed on the gate lines 108 located in the N-region 116 simultaneously. Accordingly, the second spacer layer 126 is formed against the first spacer 124, and an upper portion of the high-k layer 122 is exposed as further illustrated in FIG. 9. In addition, the high-k layer 122 extends a predetermined distance, for example from about 2 nm to about 5 nm, above the first spacer 124 and the second spacer layer 126. Accordingly, the high-k layer 122 may prevent spacer divots from occurring during the RMG process, as discussed further below.

Figure 10:
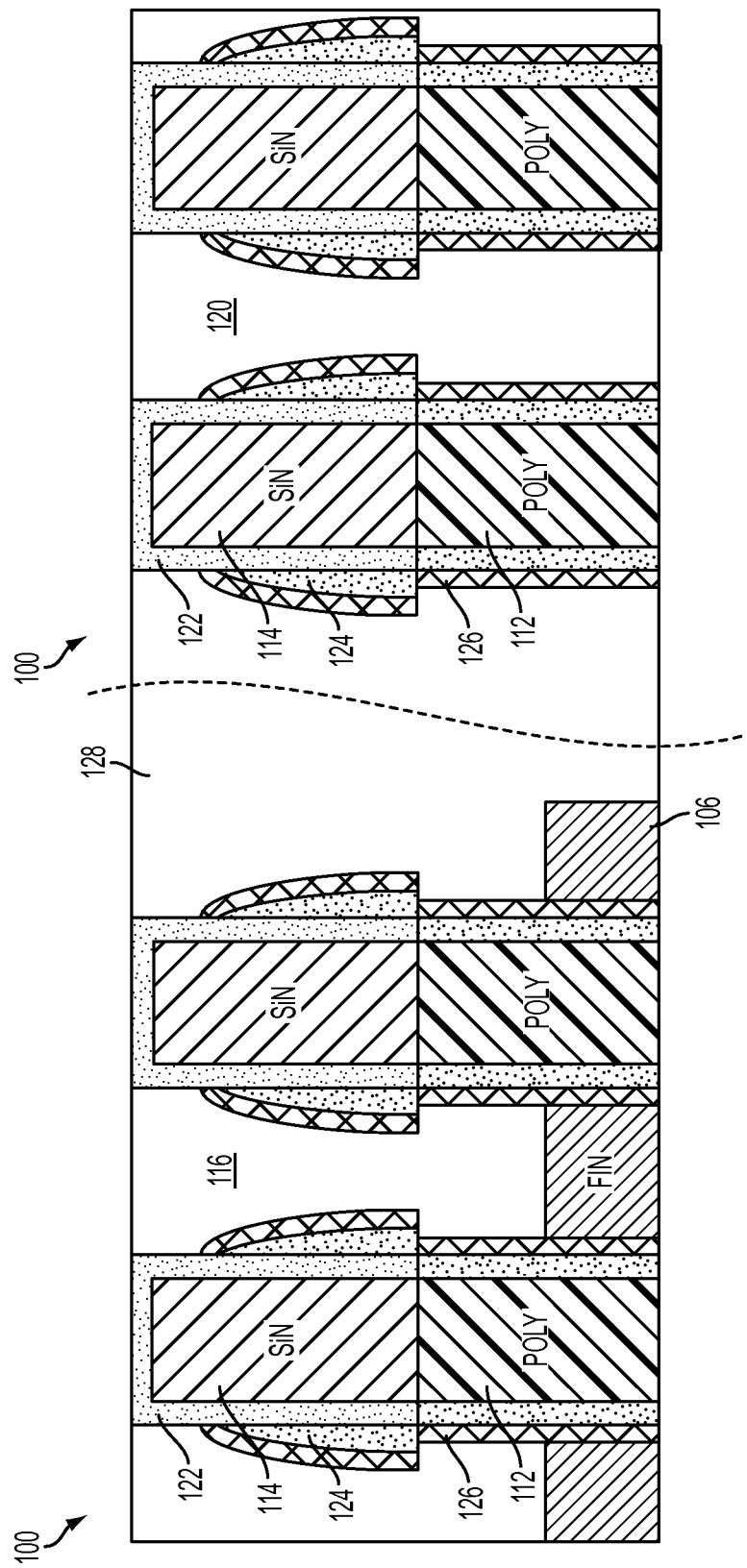

After etching the second spacer layer 126 to expose the high-k layer 122, an inter-layer dielectric (ILD) 128 may be deposited on the SOI finFET semiconductor device 100, as illustrated in FIG. 10. For example, the ILD 128 may be deposited on the SOI finFET semiconductor device 100 to cover the first spacer 124, the second space layer 126, and the high-k layer 122. The ILD 128 may have a thickness of about 150 nm for example, and may comprise a dielectric oxide material including, but not limited to, $SiO_2$, which serves to electrically isolate the gate lines 108. The ILD 128 may be deposited using various techniques including, but not limited, high density plasma (HDP) deposition. Thereafter, the ILD 128 may be polished back according to various well-known polishing procedures, such as chemical mechanical polishing/planarization (CMP) so that the ILD 128 is flush with the upper portion of the high-k layer 122. Accordingly, the high-k layer 122 and the underlying hardmask 114 included in gate lines 108 in both the N-region 116 and the N/P overlap region 120 may have a uniform thickness, i.e., height.

Figure 11:
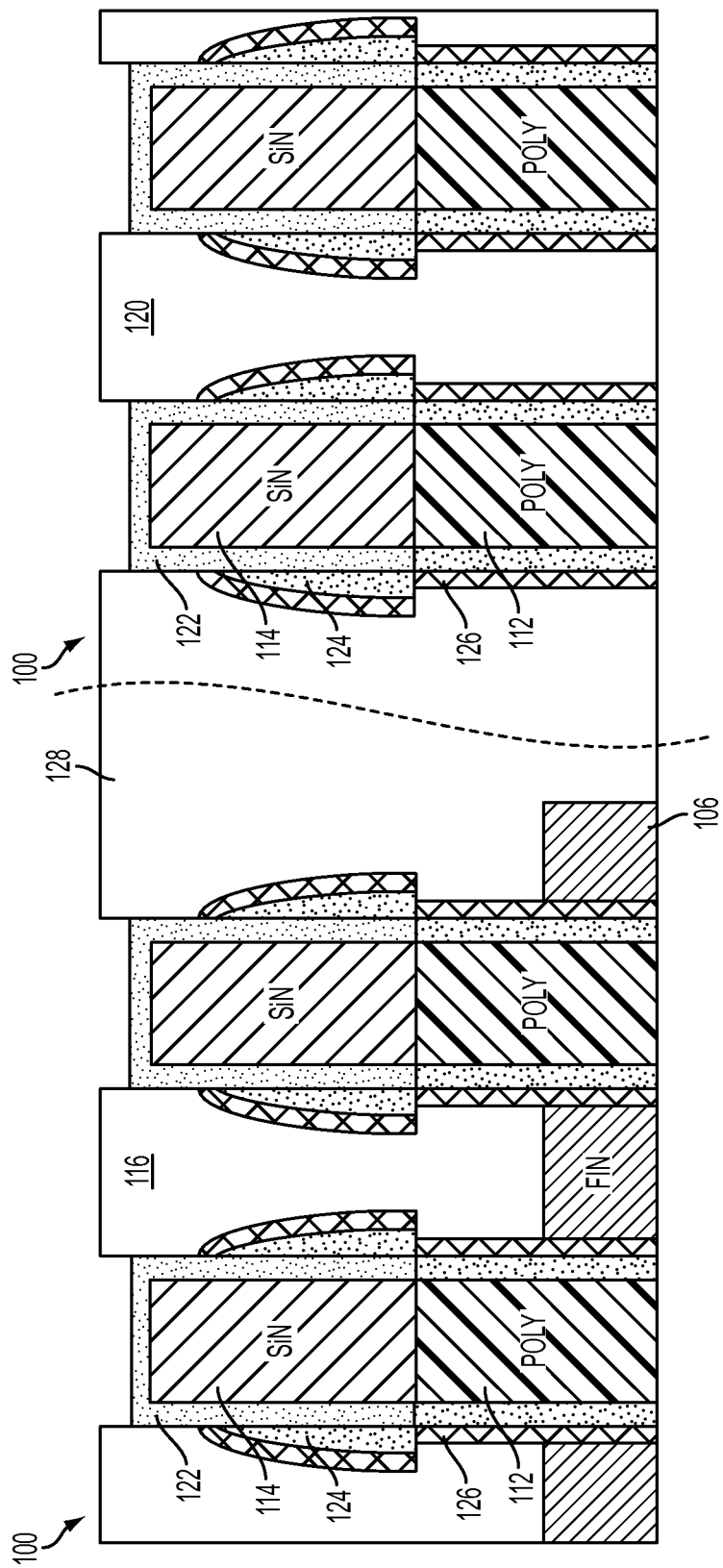
Figure 12:
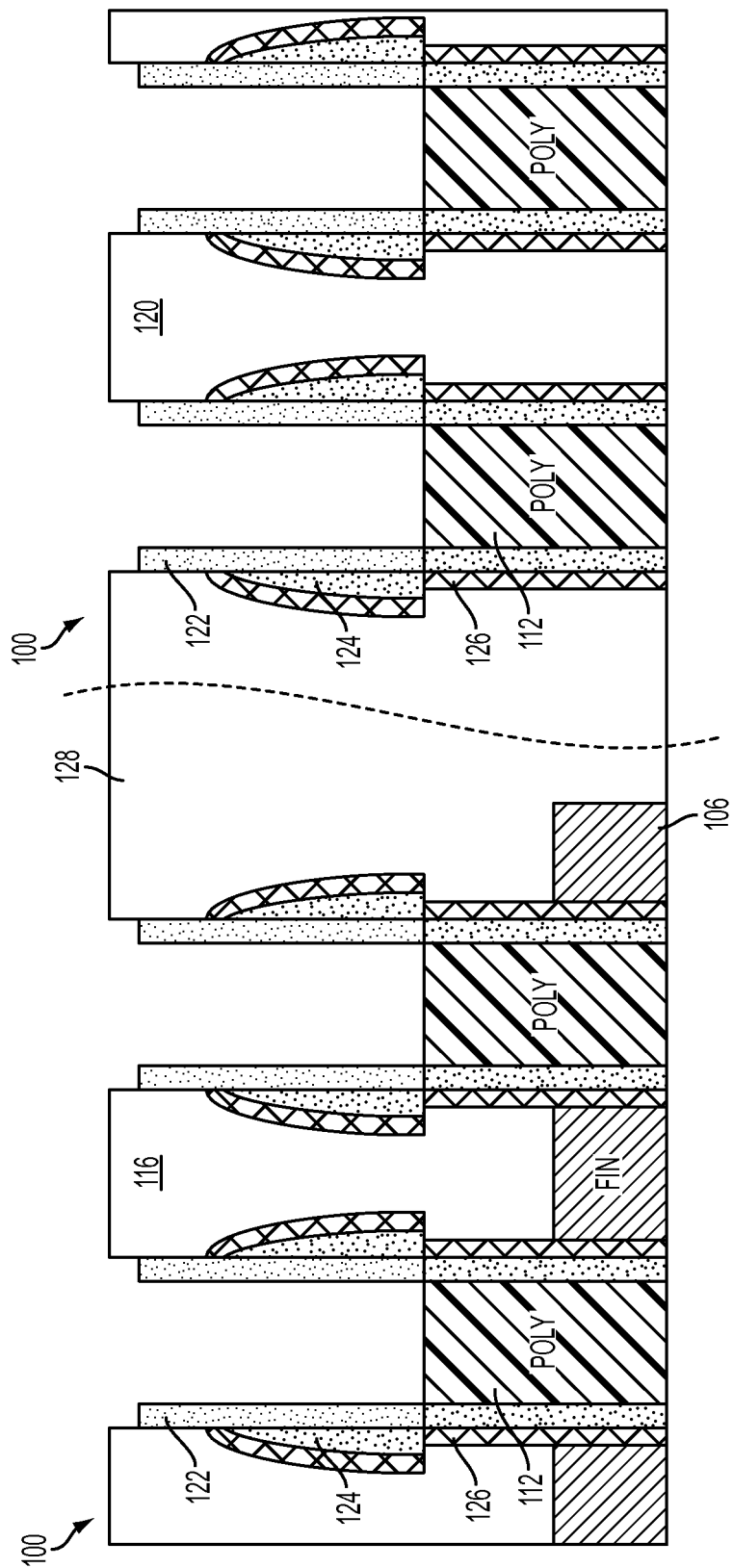
Figure 13:
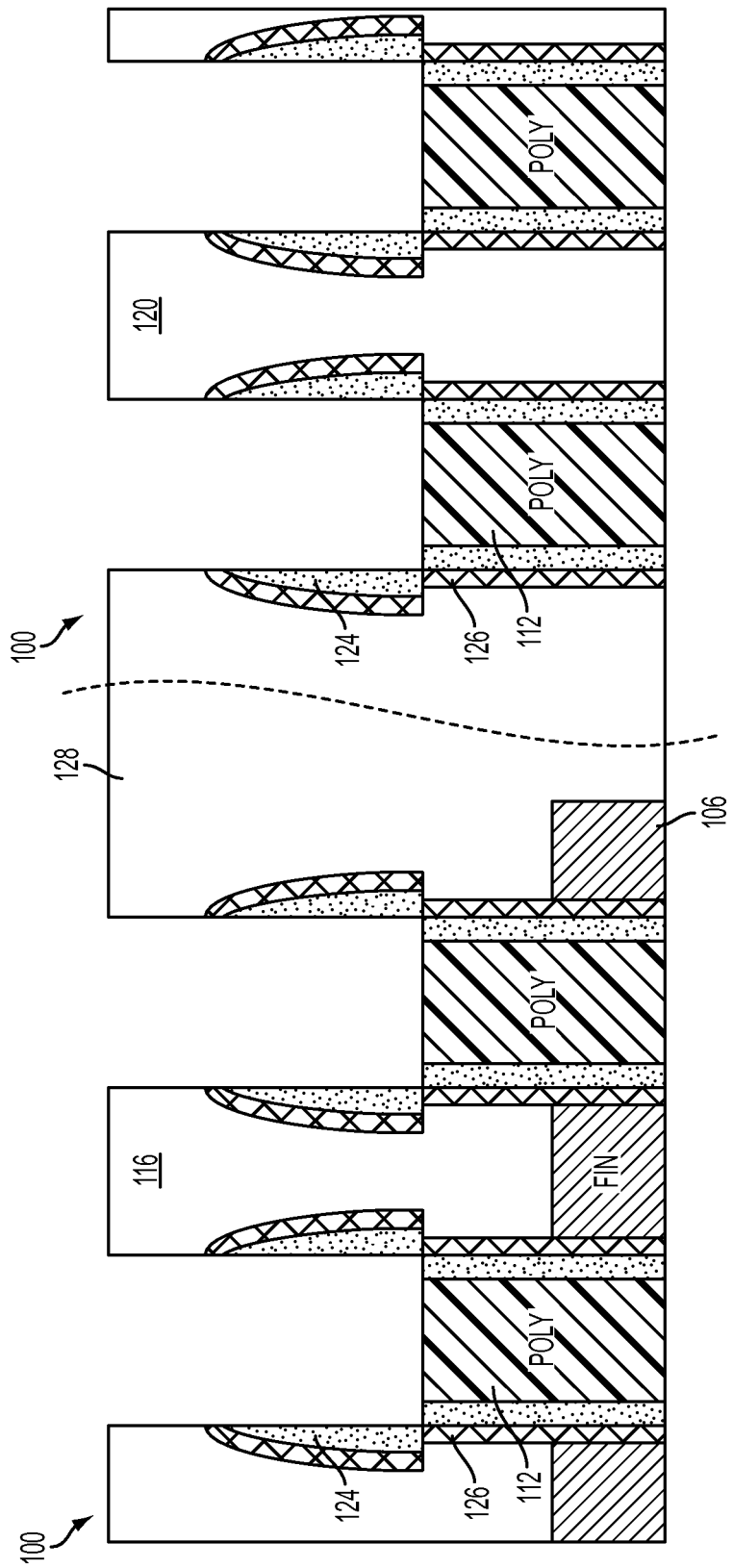

Referring now FIGS. 11-19, a series of illustrations show a replacement metal gate (RMG) process, which replaces the dummy gate 112 with a metal gate stack. More specifically, an upper surface of the high-k layer 122 may be etched from the gate lines 108 in both the N-region 116 and the N/P overlap region 120 to expose the underlying hardmask 114, as illustrated in FIG. 11. In at least one embodiment of the disclosure, a Carina™ etching process may be applied to the high-k layer 122 to achieve a selective etching process. That is, the high-k layer 122 is responsive to etching via the Carina™ etching, while remaining portions of the semiconductor device, such as the first spacer 124, the second spacer layer 126 and the hardmask 114 are not etched. Accordingly, the upper portion of the high-k layer 122 may be removed without causing a spacer divot in the first spacer 124 and the second spacer layer 126. Further, the remaining portions of the high-k layer 122 may prevent divots from occurring in the first spacer 124 and the second spacer layer 126 during etching, i.e., removal, of the hardmask 114. More specifically, the hardmask 114 may be removed uniformly, i.e., uniformly etched, in both the N-region 116 and the N/P overlap region 120 to expose the dummy gate 112 via well-known etching techniques such as RIE for example, as illustrated in FIG. 12. During the etching process to remove the hardmask 114, the remaining high-k layer 122 protects the first spacer 124 and the second spacer layer 126 from being inadvertently etched. Accordingly, over-etching of the first spacer 124 and the second spacer layer 126 may be prevented, thereby eliminating the occurrence of spacer divots.

Figure 14:
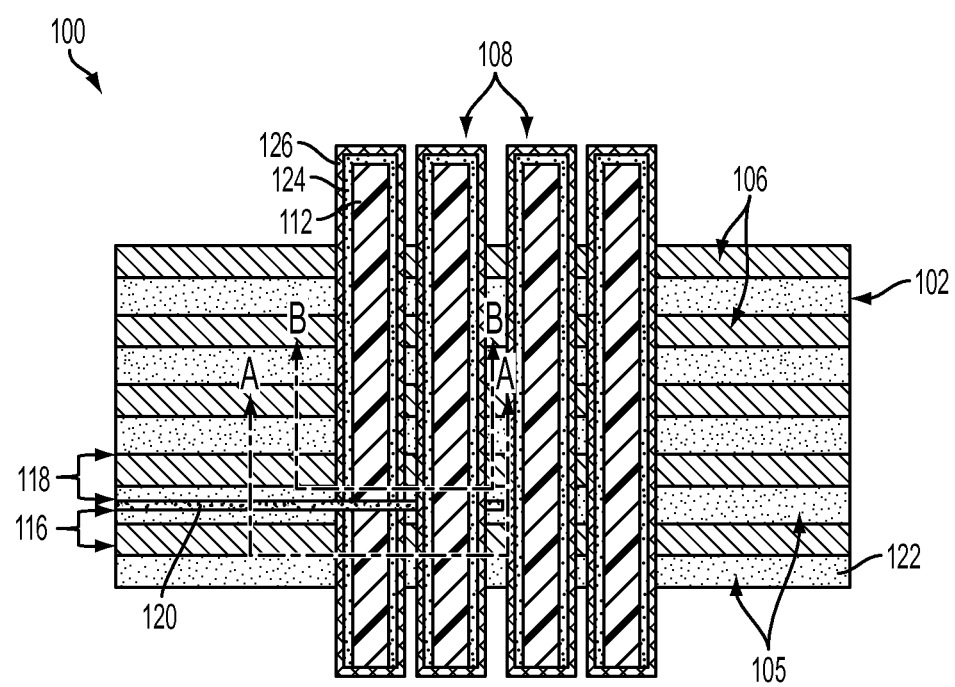
Figure 15:
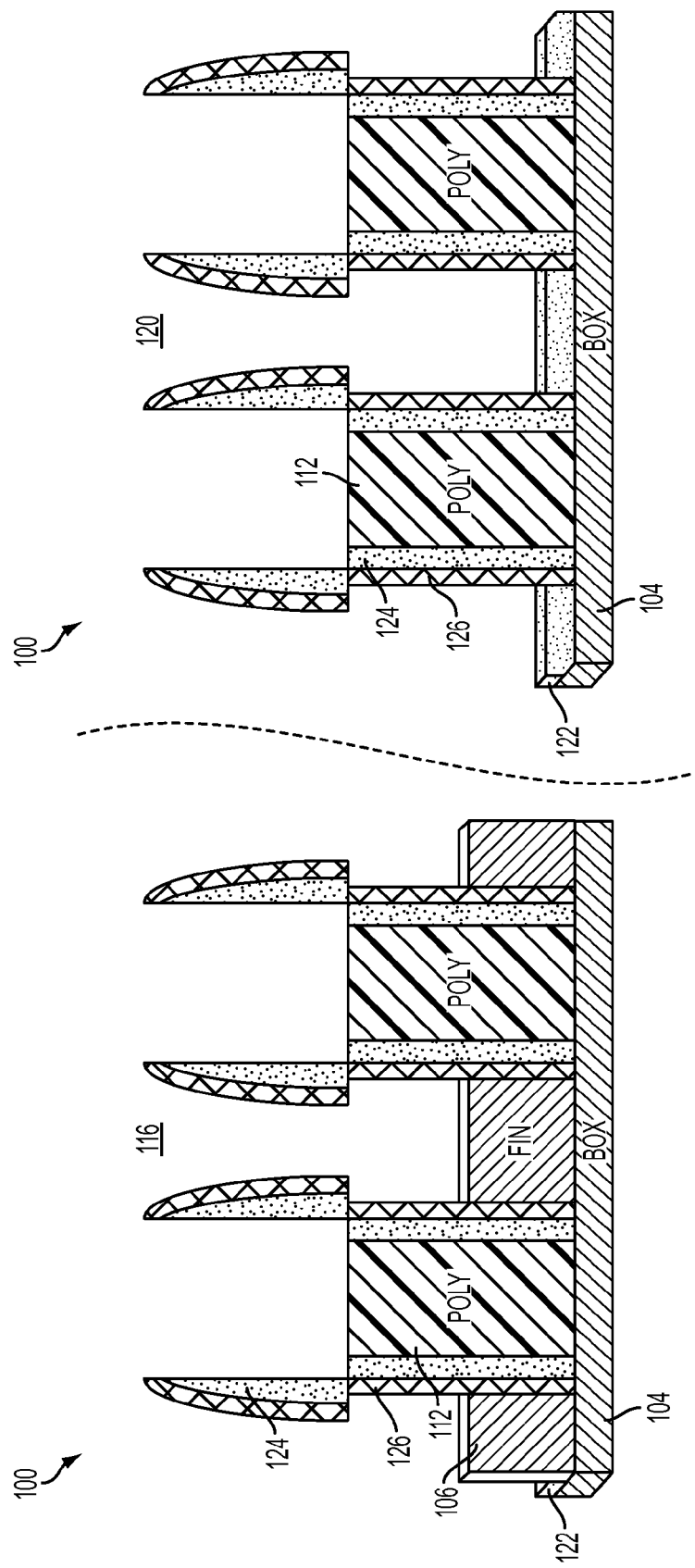

After the hardmask 114 is removed, the high-k layer 122 remaining on sides of the first spacer 124 and the second spacer layer 126 may be selectively removed via the Carina™ etching process described above, as illustrated in FIG. 13. Referring further to FIG. 14, a top view of the SOI semiconductor device 100 (excluding the ILD 128 for clarity) is illustrated after removal of the hardmask 114. Since the high-k layer 122 is selectively removed from the gate stacks 112, the high-k layer 122 remains on the BOX regions 105. Referring still to FIG. 15, the high-k layer 122 is shown to exist on the BOX region 105 in both the N-region 116 and the N/P overlap region 120. In one embodiment of the disclosure, the high-k layer 122 may exist only on the BOX layer 105 after the hardmask 114 is removed.

Figure 16:
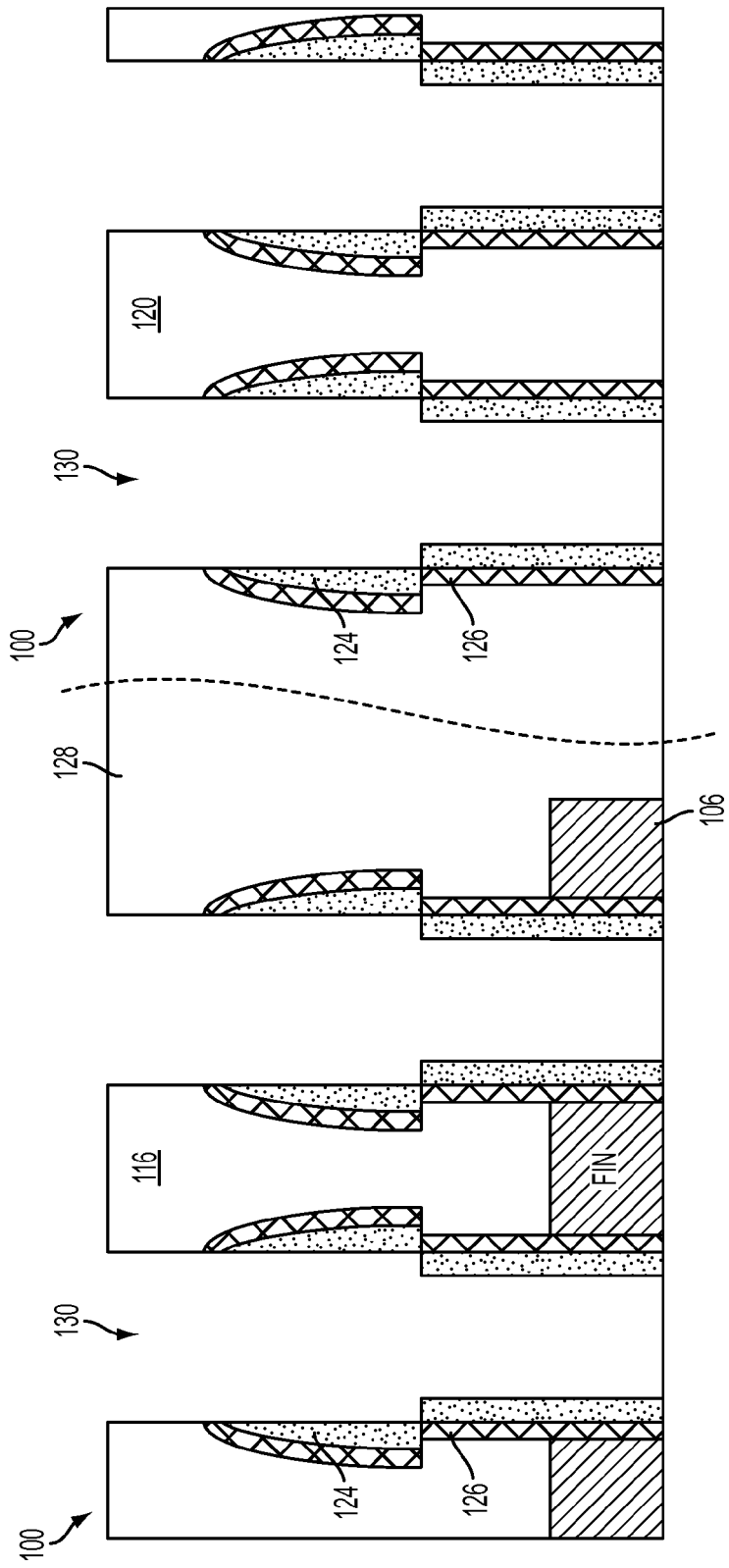
Figure 17:
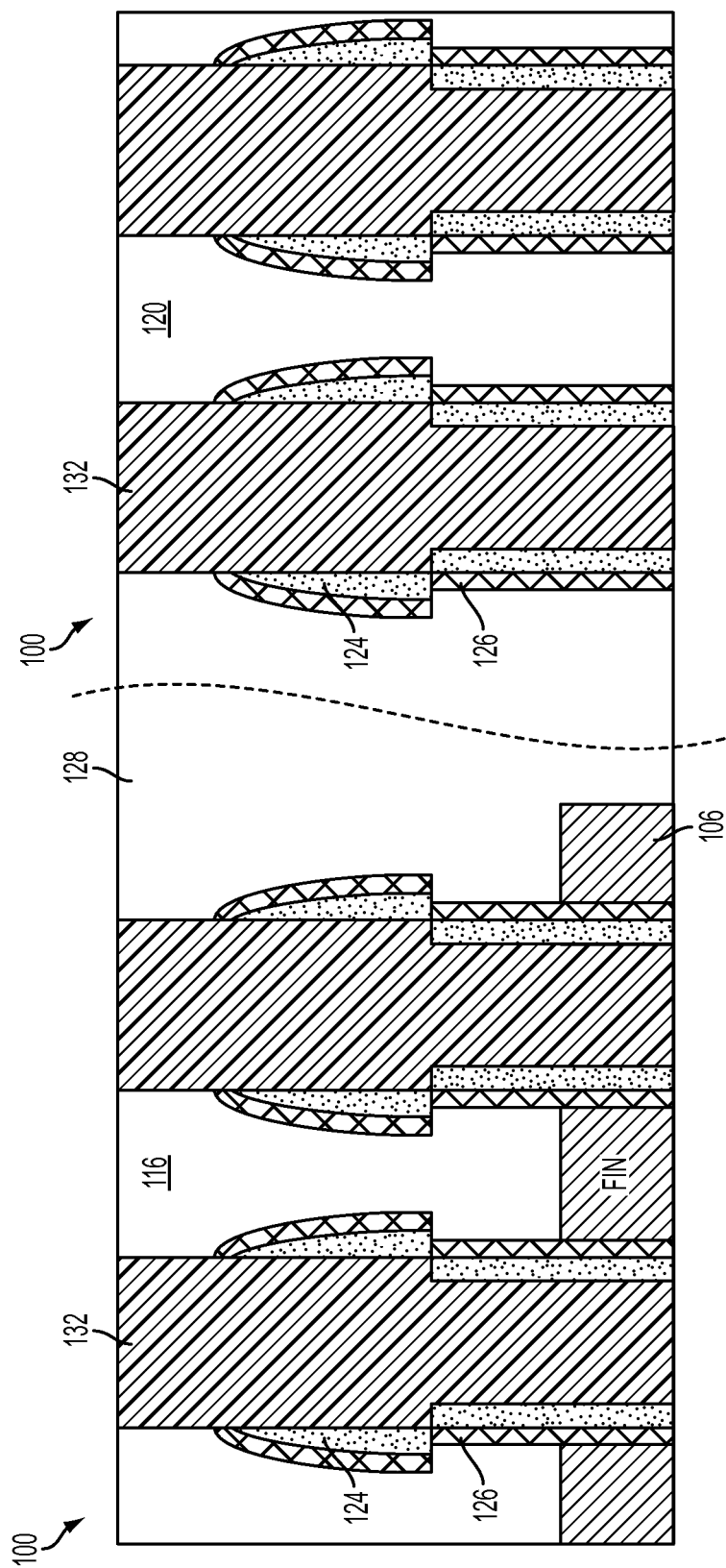
FIG. 17 illustrates a metal gate material deposited in the voids of the first doped region and the doping overlap region shown in FIG. 16.

Referring now to FIG. 16, the dummy gate 112 is removed according to the RMG process to expose a void 130 in the gate stack 110 of the gate lines 108 located in the N-region 116 and the N/P overlap region 120. A metal gate 132 is then formed in the void 130, as illustrated in FIG. 17. The metal gate 132 may be formed from a variety of metal materials including, but not limited to, aluminum (Al), tungsten (W), and a combination of different electrically conductive metal materials known in the art.

Figure 18:
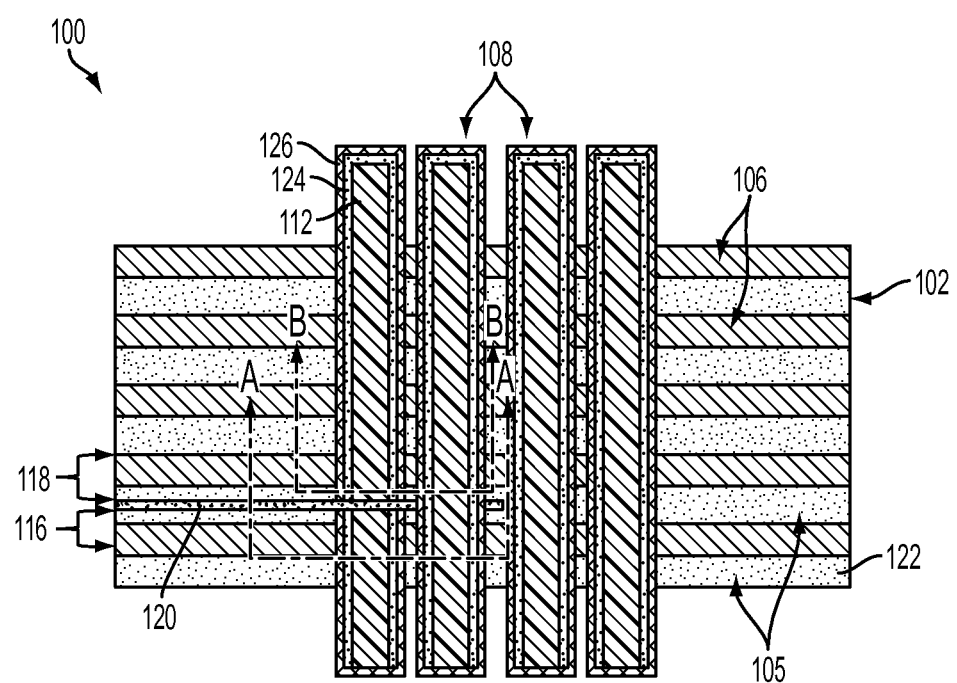
FIG. 18 illustrates a top view of a semiconductor device including the first doped region and the doping overlap region illustrated in FIG. 17 showing the metal gate material deposited in the gate lines and the high-k layer remaining on BOX regions.
Figure 19:
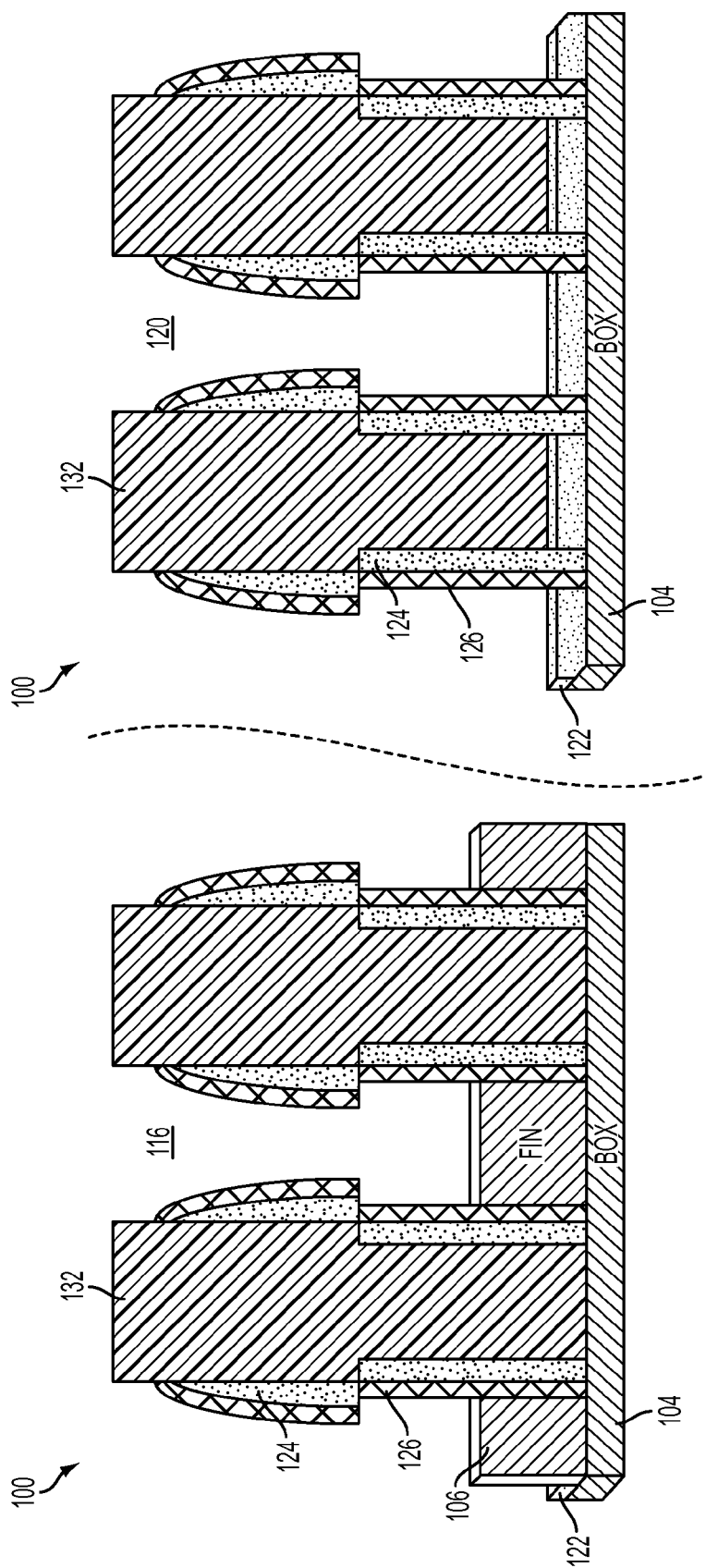
FIG. 19 illustrates cross-sectional isometric views of the first doped region and the doping overlap region of the semiconductor device shown in FIG. 18 taken along lines A-A and B-B respectively.

FIGS. 18 and 19 illustrate the SOI semiconductor device 100 after completing the RMG process. Based on the process flow described in detail above, an SOI finFET semiconductor device 100 is formed having a metal gate 132 disposed in the gate stack 110 and a high-k layer 122 disposed on BOX regions 105 located between pairs of semiconductor fins 106. Furthermore, the thickness, i.e., heights, of the metal gates 132 in the gate stacks located in the N-region 116 and the N/P region 120 are uniform with respect to one another without extending laterally over the first spacer 124 and the second spacer layer 126. Accordingly, the possibility of adjacent gate stacks short circuiting with one another is reduced.

Figure 20:
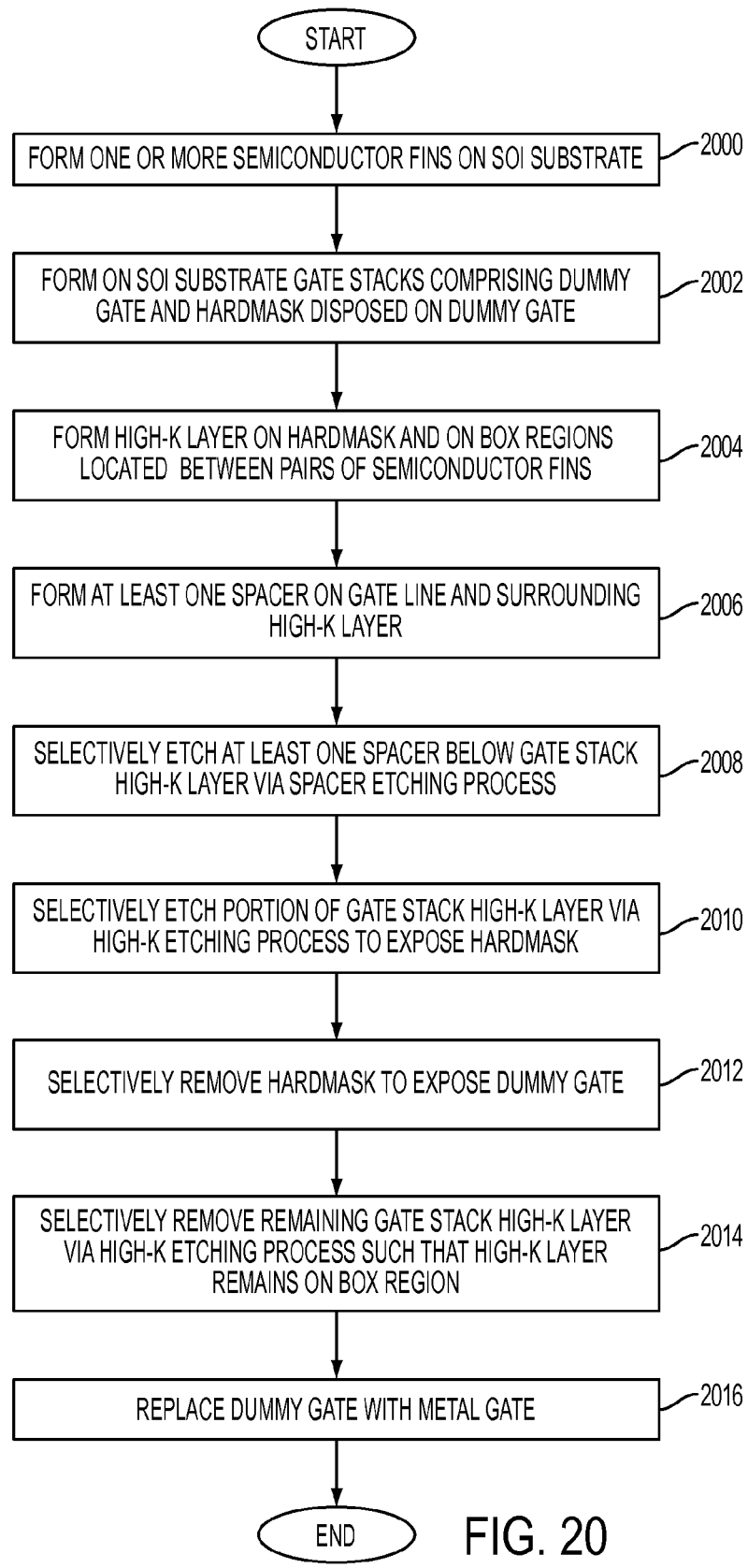
FIG. 20 is flow diagram illustrating a method of controlling gate height of a finFET semiconductor device according to an embodiment of the disclosure.

Referring now to FIG. 20, a flow diagram illustrates a method of controlling gate height of a finFET semiconductor device according to an embodiment of the disclosure. At operation 2000, one or more semiconductor fins are formed on a SOI semiconductor substrate. The semiconductor fins may be formed according to conventional deposition, lithographic and etching process such as, for example, sidewall image transferring (SIT). At operation 2002, gate lines are formed on the SOI substrate. The gate lines may be formed via RIE, for example, and may comprise a gate stack having a dummy gate and a hardmask disposed over the dummy gate. In at least one embodiment of the disclosure, the dummy gate may be formed from polysilicon and the hardmask me be formed from SiN. At operation 2004, a high-k layer is formed the hardmask of each gate stack and on each BOX region located between each pairs of semiconductor fins. The high-k layer may be formed from, for example, $HfO_2$. At least one spacer is formed on the gate line at operation 2006. In at least one example of the disclosure, a nitride spacer is formed on the gate stack such that high-k layer is disposed between the spacer and the hardmask.

The spacer is selectively etched at operation 2008 such that a portion of the high-k layer extends beyond the etched spacer. During the spacer etching, the high-k layer may server to protect the underlying hardmask from inadvertent over-etching. Accordingly, a uniform thickness, i.e., height, of the hardmask may be achieved in both a substantially doped region, such as an N-region, and a doped overlap region, such as an N-P overlap region. At operation 2010, a portion of the high-k layer is selectively etched via a high-k etching process to expose the underlying hardmask. The high-k etching process may include a Carina™ etching process, which selectively etches the high-k layer while allowing the spacer to remain intact. The hardmask is removed to expose the dummy gate at operation 2012. Various methods may be used to remove the hardmask including, but not limited to, RIE. At operation 2014, the remaining high-k layer disposed against the spacers is selectively removed. As mentioned above, a Carina™ etching process may be applied to the remaining high-k layer such that high-k layer is removed completely from the gate stack, while the spacer remains intact. At operation 2016, the dummy gate is replaced with a metal gate via, for example, an RMG process and the method ends. Accordingly, the high-k layer may serve to protect the hardmask during spacer etching. The high-k layer may also protect the spacers from inadvertent over-etching during removal of the hardmask. As a result, spacer divots in the spacers may be prevented.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, operations, elements, and/or components, but do not preclude the presence or addition of one or more other features, integers, operations, element components, and/or groups thereof.

The flow diagrams depicted herein are just one example. There may be many variations to this diagram or the operations described therein without departing from the spirit of the disclosure. For instance, the operations may be performed in a differing order. Further, operations may be added, deleted or modified. All of these variations are considered a part of the claimed disclosure.

While various embodiments to the disclosure have been described, it will be understood that those skilled in the art, both now and in the future, may make various modifications to the embodiments which fall within the scope of the following claims. These claims should be construed to maintain the proper protection for the disclosure first described.

The invention claimed is:

1. A method of fabricating a semiconductor device, comprising:
   forming a plurality of semiconductor fins and a plurality of gate lines on a silicon-on-insulator (SOI) substrate, each gate line comprising a gate stack including a dummy gate and a hardmask formed on the dummy gate;
   selectively forming a gate stack high dielectric (high-k) layer on the hardmask; and
   forming at least one spacer on each gate line, the gate stack high-k layer of each gate line disposed between the at least one spacer and the hardmask.

2. The method of claim 1, further comprising forming a high-k layer on a buried oxide (BOX) region of the SOI substrate located between each semiconductor fin.

3. The method of claim 2, further comprising etching the at least one spacer via a first spacer etching process such that a height of the at least one spacer is less than a height of the gate stack high-k layer.

4. The method of claim 3, wherein the etching the at least one spacer further comprises etching a first spacer via the first spacer etching process.

5. The method of claim 4, wherein the etching the at least one spacer further comprises forming a second spacer over the first spacer etched according to the first spacer etching process and etching the second spacer via a second spacer etching process such that the first and second spacers have a height less than a height of the gate stack high-k layer.

6. The method of claim 5, further comprising etching a first portion of the gate stack high-k layer via a high-k etching process such that the dummy gate is exposed.

7. The method of claim 6, wherein the high-k etching process selectively etches only the gate stack high-k layer while inhibiting etching of the first and second spacers.

8. The method of claim 7, further comprising etching a remaining gate stack high-k layer disposed on the first and second spacer via the high-k etching process after removing the hardmask.

9. The method of claim 8, further comprising removing the dummy gate to form a void in the gate stack and forming a metal gate in the void.

10. The method of claim 2, wherein the forming the high-k layer and the gate stack high-k layer further comprises selectively growing $HfO_2$ on each hardmask and each BOX region while inhibiting growth of the $HfO_2$ on the semiconductor fins.

11. A method of preventing spacer divots in a gate stack of a SOI semiconductor finFET, the method comprising:
    simultaneously forming a first high dielectric (high-k) layer on a buried oxide (BOX) region located between pairs of semiconductor fins and a second high-k layer on a hardmask disposed on a dummy gate of the gate stack;
    forming at least one spacer on each gate line such that the second high-k layer is disposed between the at least one spacer and the hardmask;
    etching the at least one spacer via a first etching process such that a height of the at least one spacer is less than a height of the second high-k layer; and
    etching a first portion of the second high-k layer via a high-k etching process that is different from the first etching process to expose the hardmask.

12. The method of claim 11, wherein the at least one spacer withstands etching from the high-k etching process.

13. The method of claim 12, further comprising:
removing the hardmask; and
etching a remaining portion of the second high-k layer disposed adjacent the at least one spacer via the high-k etching process after removing the hardmask such that the first high-k layer remains on the BOX region.

14. The method of claim 13, further comprising:
removing the dummy gate to form a void in the gate stack; and
forming a metal gate in the void.

15. The method of claim 12, wherein the simultaneously forming the first and second high-k layers comprises growing first and second high-k layers comprising $HfO_2$ via atomic layer deposition (ALD).

16. The method of claim 15, wherein the ALD comprises positive patterning ALD.

17. The method of claim 16, wherein the positive pattern ALD comprises depositing blocking co-polymers at the semiconductor fins to prevent growth of the $HfO_2$ thereon.

18. The method of claim 15, wherein the ALD comprises ALD nucleation.

19. The method of claim 18, wherein the semiconductor fins are formed from silicon (Si) to inhibit growth of $HfO_2$ thereon, and the BOX region and the hardmask comprise $SiO_2$ and SiN, respectively, to promote growth of the $HfO_2$ thereon.

* * * * *